(12) United States Patent
Ito et al.

(10) Patent No.: US 9,929,043 B2
(45) Date of Patent: Mar. 27, 2018

(54) SEMICONDUCTOR MEMORY DEVICE AND METHOD FOR MANUFACTURING THE SAME

(71) Applicant: Toshiba Memory Corporation, Minato-ku (JP)

(72) Inventors: Takamasa Ito, Yokkaichi (JP); Hiroki Yamashita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 7 days.

(21) Appl. No.: 15/011,888

(22) Filed: Feb. 1, 2016

(65) Prior Publication Data
US 2017/0025350 A1   Jan. 26, 2017

Related U.S. Application Data

(60) Provisional application No. 62/196,008, filed on Jul. 23, 2015.

(51) Int. Cl.
*H01L 21/768* (2006.01)
*H01L 27/115* (2017.01)
(Continued)

(52) U.S. Cl.
CPC .. *H01L 21/76879* (2013.01); *H01L 27/11582* (2013.01); *H01L 29/42344* (2013.01); *H01L 29/42376* (2013.01)

(58) Field of Classification Search
CPC ......... H01L 21/76879; H01L 21/76802; H01L 23/522; H01L 27/115–27/11597; H01L 29/4234–29/42352; H01L 29/66825–29/66833; H01L 29/792–29/7926; H01L 2924/145–2924/1451; H01L 2924/1438;
(Continued)

(56) References Cited

U.S. PATENT DOCUMENTS 8,435,857 B2   5/2013   Kiyotoshi
8,470,671 B1   6/2013   Lin et al.
(Continued)

FOREIGN PATENT DOCUMENTS

JP   2010-245551   10/2010

*Primary Examiner* — Daniel Luke
*Assistant Examiner* — Khatib Rahman
(74) *Attorney, Agent, or Firm* — Oblon, McClelland, Maier & Neustadt, L.L.P.

(57) ABSTRACT

A semiconductor memory device according to an embodiment includes: a pair of insulating members separated from each other, the pair of insulating members extending in a first direction; a plurality of electrode films and a plurality of inter-layer insulating films disposed between the pair of insulating members and stacked alternately along a second direction, the second direction intersecting the first direction; a plurality of semiconductor pillars extending in the second direction and piercing the plurality of electrode films and the plurality of inter-layer insulating films; and a charge storage film disposed between one of the semiconductor pillars and one of the electrode films. An end portion on one of the insulating members side of a first electrode film of the electrode films is thicker than a central portion of the first electrode film between the pair of insulating members.

13 Claims, 18 Drawing Sheets

(51) Int. Cl.
*H01L 27/11582* (2017.01)
*H01L 29/423* (2006.01)

(58) Field of Classification Search
CPC ....... H01L 2924/14511; G11C 16/0483; G11C 16/0466; G11C 11/5671
See application file for complete search history.

(56) References Cited

U.S. PATENT DOCUMENTS

| | | | |
|---|---|---|---|
| 8,569,829 B2 | 10/2013 | Kiyotoshi | |
| 2009/0267131 A1* | 10/2009 | Nitta | H01L 21/764 257/316 |
| 2014/0284695 A1* | 9/2014 | Won | H01L 29/7926 257/324 |
| 2016/0293621 A1* | 10/2016 | Huang | H01L 27/0207 |

\* cited by examiner

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/196,008, filed on Jul. 23, 2015; the entire contents of which are incorporated herein by reference.

FIELD

Embodiments relate to a semiconductor memory device and a method for manufacturing the same.

BACKGROUND

In recent years, a stacked semiconductor memory device has been proposed in which memory cells are integrated three-dimensionally. In the stacked semiconductor memory device as well, even more downscaling is necessary in both the planar direction and the stacking direction to further increase the integration. However, interconnect resistance undesirably increases when the interconnects are downscaled.

DETAILED DESCRIPTION

A semiconductor memory device according to an embodiment includes: a pair of insulating members separated from each other, the pair of insulating members extending in a first direction; a plurality of electrode films and a plurality of inter-layer insulating films disposed between the pair of insulating members and stacked alternately along a second direction, the second direction intersecting the first direction; a plurality of semiconductor pillars extending in the second direction and piercing the plurality of electrode films and the plurality of inter-layer insulating films; and a charge storage film disposed between one of the semiconductor pillars and one of the electrode films. An end portion on one of the insulating members side of a first electrode film of the electrode films is thicker than a central portion of the first electrode film between the pair of insulating members.

A method for manufacturing a semiconductor memory device according to an embodiment includes: forming a stacked body by stacking inter-layer insulating films and first films alternately along a first direction; making a plurality of holes in the stacked body, the plurality of holes extending in the first direction; forming a first insulating film on inner surfaces of the holes; forming a semiconductor pillar on the first insulating film; making a pair of slits in the stacked body at positions having the plurality of holes interposed between the positions, the pair of slits extending in a second direction intersecting the first direction; making spaces between the inter-layer insulating films by removing the first films and a portion of the inter-layer insulating films via the slits, an end portion of the space on one of the slits side being wider than a central portion of the space between the pair of slits; forming a second insulating film on inner surfaces of the spaces and on exposed surfaces of the first insulating film; forming an electrode film inside the spaces by depositing a conductive material on the second insulating film; and forming an insulating member inside the slits.

Embodiments of the invention will now be described with reference to the drawings.

First Embodiment

First, a first embodiment will be described.

Figure 1:
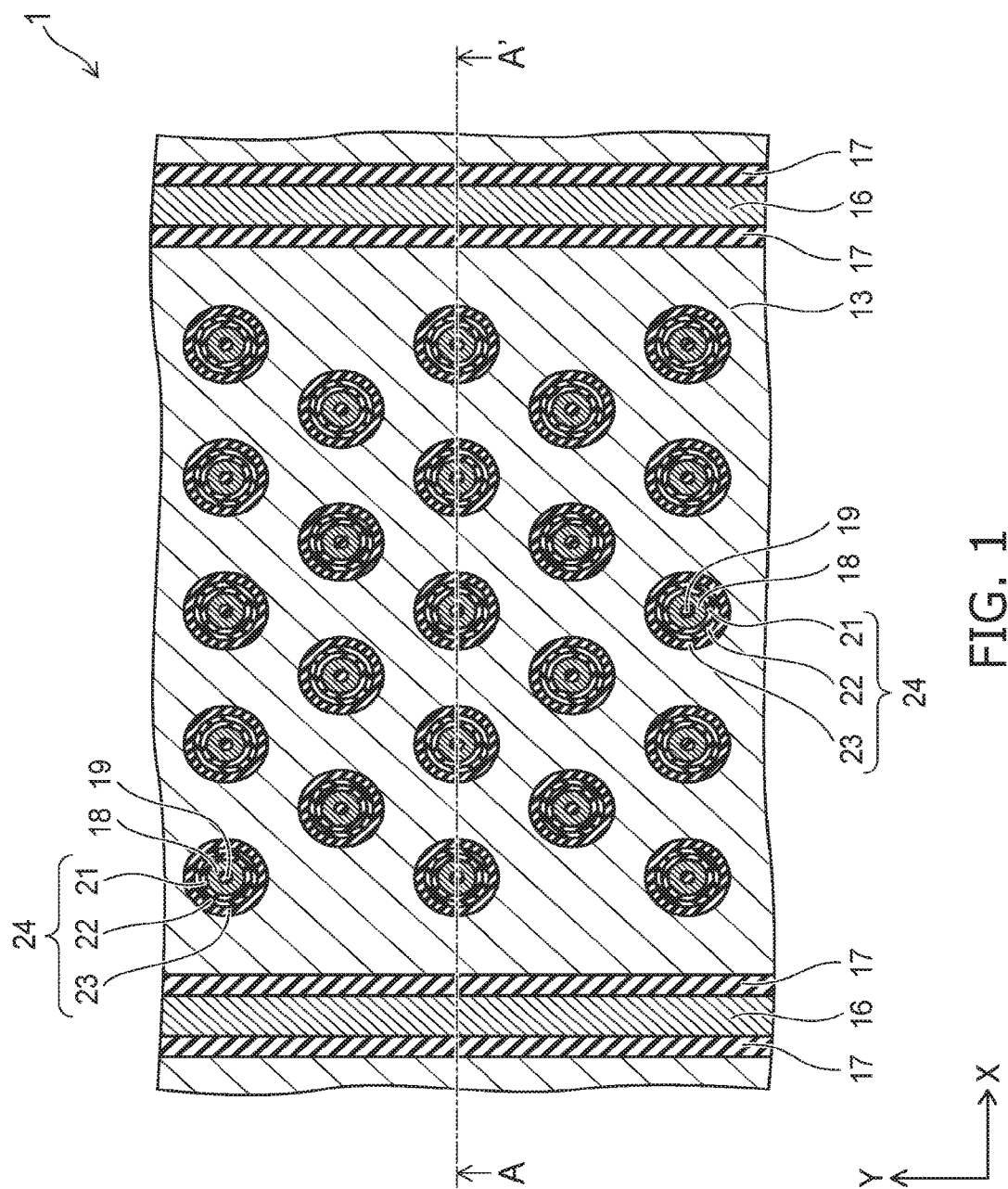
FIG. 1 and FIG. 2 are cross-sectional views showing a semiconductor memory device according to a first embodiment.
Figure 2:
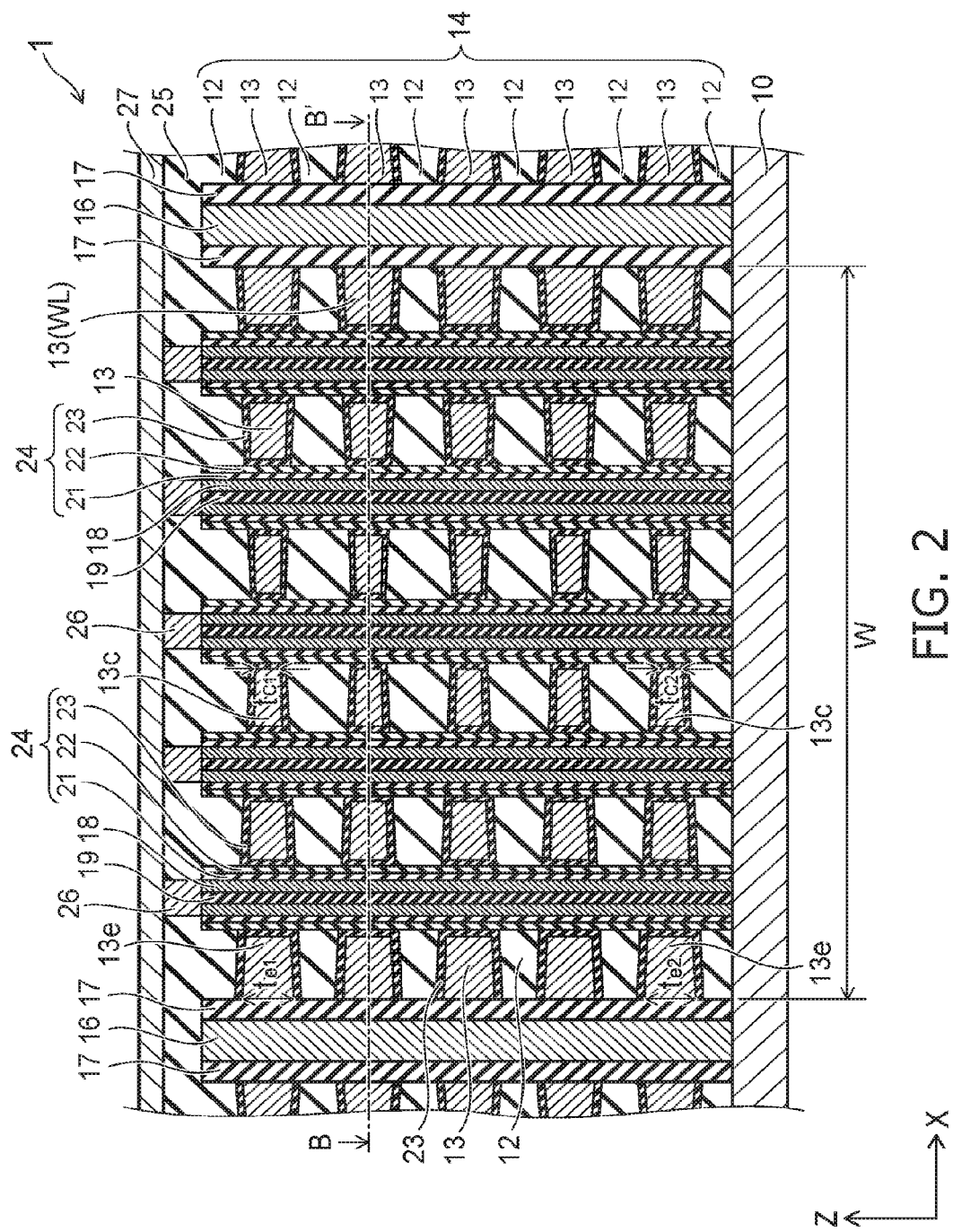

FIG. 1 and FIG. 2 are cross-sectional views showing a semiconductor memory device according to the embodiment.

FIG. 1 shows a cross section along line B-B' shown in FIG. 2; and FIG. 2 shows a cross section along line A-A' shown in FIG. 1.

As shown in FIG. 1 and FIG. 2, a silicon substrate 10 is provided in the semiconductor memory device 1 according to the embodiment. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface of the silicon substrate 10 is taken as a "Z-direction."

A stacked body 14 in which inter-layer insulating films 12 and electrode films 13 are stacked alternately along the Z-direction is provided on the silicon substrate 10. For example, the inter-layer insulating films 12 are formed of an insulating material such as silicon oxide ($SiO_2$), etc. The electrode films 13 are formed of a conductive material and are formed of, for example, at least one type of metal selected from the group consisting of tungsten (W), titanium (Ti), tantalum (Ta), cobalt (Co), and nickel (Ni). For example, in the electrode film 13, a main body unit that is made of tungsten is provided; and a barrier metal layer that is made of titanium (Ti) and titanium nitride (TiN) may be formed on the surface of the main body unit.

Multiple source electrodes 16 that are separated from each other and extend in the Y-direction are provided inside the stacked body 14. The source electrodes 16 pierce the stacked body 14 in the Z-direction; and the lower ends of the source electrodes 16 are connected to the silicon substrate 10. For example, insulating members 17 that have plate configurations and are made of silicon oxide are provided on the two side surfaces of each of the source electrodes 16. Thereby, the inter-layer insulating films 12 and the electrode films 13 are subdivided into portions having multiple band configurations by the source electrodes 16 and the insulating members 17. Each portion of the electrode film 13 having the band configuration is used as a word line WL extending in the Y-direction. In other words, the multiple electrode films 13 (the word lines WL) and the multiple inter-layer insulating films 12 that are stacked alternately are arranged along the Z-direction between a pair of mutually-adjacent insulating members 17. The electrode film 13 of the uppermost level and the electrode film 13 of the lowermost level of the stacked body 14 function respectively as an upper selection gate electrode and a lower selection gate electrode.

Multiple silicon pillars 18 that extend in the Z-direction are provided in the portion of the stacked body 14 between the pair of mutually-adjacent insulating members 17. The silicon pillars 18 pierce the electrode films 13 and the inter-layer insulating films 12; and the lower ends of the silicon pillars 18 are connected to the silicon substrate 10. When viewed from the Z-direction, the silicon pillars 18 are disposed in a staggered configuration. For example, three mutually-adjacent silicon pillars 18 are disposed at the vertices of an imaginary equilateral triangle. The configuration of the silicon pillar 18 is a cylindrical configuration; and an insulating member 19 is provided inside the silicon pillar 18. For example, the insulating member 19 is formed of silicon oxide; and the configuration of the insulating member 19 is a circular columnar configuration extending in the Z-direction.

A tunneling insulating film 21 is provided on the side surface of the silicon pillar 18. Although the tunneling insulating film 21 normally is insulative, the tunneling insulating film 21 is a film in which a tunneling current flows when a prescribed voltage within the range of the drive voltage of the semiconductor memory device 1 is applied, and is, for example, a single-layer silicon oxide film or an ONO film in which a silicon oxide layer, a silicon nitride layer, and a silicon oxide layer are stacked. A charge storage film 22 is provided on the tunneling insulating film 21. The charge storage film 22 is a film that can store charge, is formed of, for example, a material having trap sites of electrons, and is formed of, for example, silicon nitride ($Si_3N_4$).

A blocking insulating film 23 is provided between the silicon pillar 18 and the electrode films 13 and between the inter-layer insulating films 12 and the electrode films 13. The blocking insulating film 23 is a film in which a current substantially does not flow even when a voltage within the range of the drive voltage of the semiconductor memory device 1 is applied and is, for example, a stacked film that is made of a silicon oxide layer, a hafnium oxide layer ($HfO_2$), and a silicon oxide layer. A memory film 24 includes the tunneling insulating film 21, the charge storage film 22, and the blocking insulating film 23. The memory film 24 is disposed between the silicon pillar 18 and the electrode films 13.

An inter-layer insulating film 25 is provided on the stacked body 14; and plugs 26 are provided inside the inter-layer insulating film 25. The lower ends of the plugs 26 are connected to the silicon pillars 18. Multiple bit lines 27 that extend in the X-direction are provided on the inter-layer insulating film 25. The bit lines 27 are connected to the upper ends of the plugs 26.

Also, an end portion 13e of each of the electrode films 13 on the insulating member 17 side between the pair of insulating members 17 is thicker than a central portion 13c of the electrode film 13 between the pair of insulating members 17. In other words, $t_{e1} > t_{c1}$, where the thickness, i.e., the length in the Z-direction, of the end portion 13e is $t_{e1}$, and the thickness of the central portion 13c is $t_{c1}$. For example, the difference between the thickness $t_{e1}$ of the end portion 13e and the thickness $t_{c1}$ of the central portion 13c is 5 nm (nanometers) or more. In other words, $t_{e1} - t_{c1} \geq 5$ nm.

In the embodiment, the electrode film 13 becomes thicker continuously from the central portion 13c toward the end portion 13e. The distance between the pair of mutually-adjacent insulating members 17, i.e., a width W of the word line WL, is, for example, 500 to 1000 nm. Therefore, for example, in one XZ cross section, the value of the ratio of the difference ($t_{e1} - t_{c1}$) between the thickness $t_{e1}$ of the end portion 13e and the thickness $t_{c1}$ of the central portion 13c of the electrode film 13 to the distance W between the pair of insulating members 17 (($t_{e1} - t_{c1}$)/W) is 0.005 or more. In other words, $(t_{e1} - t_{c1})/W \geq 0.005$.

As an example, the thickness $t_{c1}$ is 35 nm; the thickness $t_{e1}$ is 28 nm; the thickness of the central portion of the inter-layer insulating film 12 between the insulating members 17 is 30 nm; and the width W of the word line WL is 500 to 1000 nm.

Also, the difference between the thicknesses of the electrode films 13 is dependent also on the position in the Z-direction inside the stacked body 14; and the difference of the thicknesses is larger at the electrode films 13 of the upper levels, that is, increases as the electrode film 13 is distal to the silicon substrate 10. In other words, as shown in FIG. 2, the difference ($t_{e1} - t_{c1}$) between the thickness $t_{e1}$ of the end portion 13e and the thickness $t_{c1}$ of the central portion 13c for the electrode films 13 of relatively upper levels is larger than the difference ($t_{e2} - t_{c2}$) between the thickness $t_{e2}$ of the end portion 13e and the thickness $t_{c2}$ of the central portion 13c for the electrode films 13 of relatively lower levels. That is, $(t_{e1} - t_{c1}) > (t_{e2} - t_{c2})$.

By such a configuration, in the semiconductor memory device 1, the silicon pillars 18 are connected between the source electrodes 16 and the bit lines 27. Also, a memory cell transistor is formed, with the tunneling insulating film 21, the charge storage film 22, and the blocking insulating film 23 interposed, at each intersection between the silicon pillars 18 and the electrode films 13. Also, NAND strings in which the multiple memory cell transistors are connected in series are formed between the source electrodes 16 and the bit lines 27.

A method for manufacturing the semiconductor memory device according to the embodiment will now be described.

FIG. 3 to FIG. 8 are cross-sectional views showing the method for manufacturing the semiconductor memory device according to the embodiment.

Figure 9A:
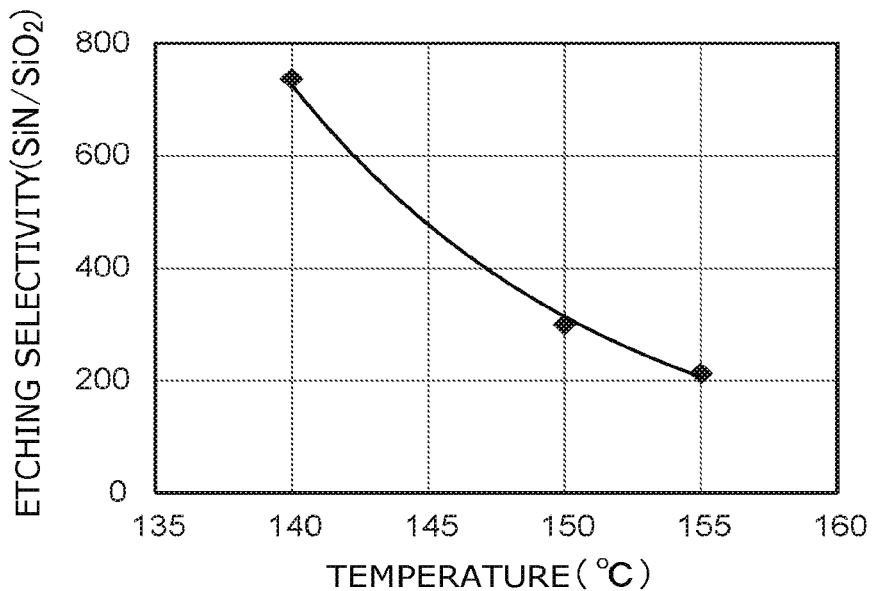
FIG. 9A is a graph showing the effects of the temperature of the etchant on the etching selectivity, where the horizontal axis is the temperature, and the vertical axis is the etching selectivity.
Figure 9B:
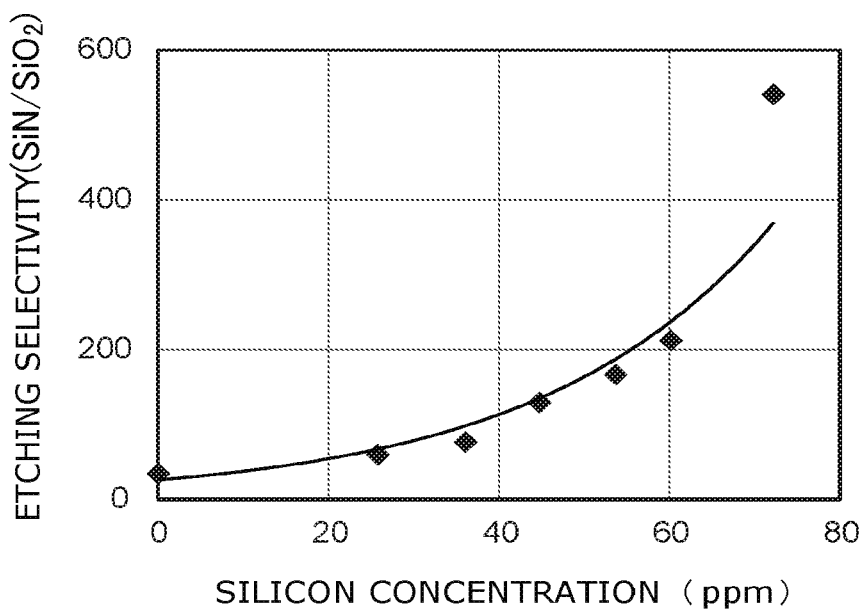
FIG. 9B is a graph showing the effects of the silicon concentration in the etchant on the etching selectivity, where the horizontal axis is the silicon concentration in the etchant, and the vertical axis is the etching selectivity.

FIG. 9A is a graph showing the effects of the temperature of the etchant on the etching selectivity, where the horizontal axis is the temperature, and the vertical axis is the etching selectivity of silicon nitride to silicon oxide ($SiN/SiO_2$); and FIG. 9B is a graph showing the effects of the silicon concentration in the etchant on the etching selectivity, where the horizontal axis is the silicon concentration in the etchant, and the vertical axis is the etching selectivity ($SiN/SiO_2$).

Figure 10:
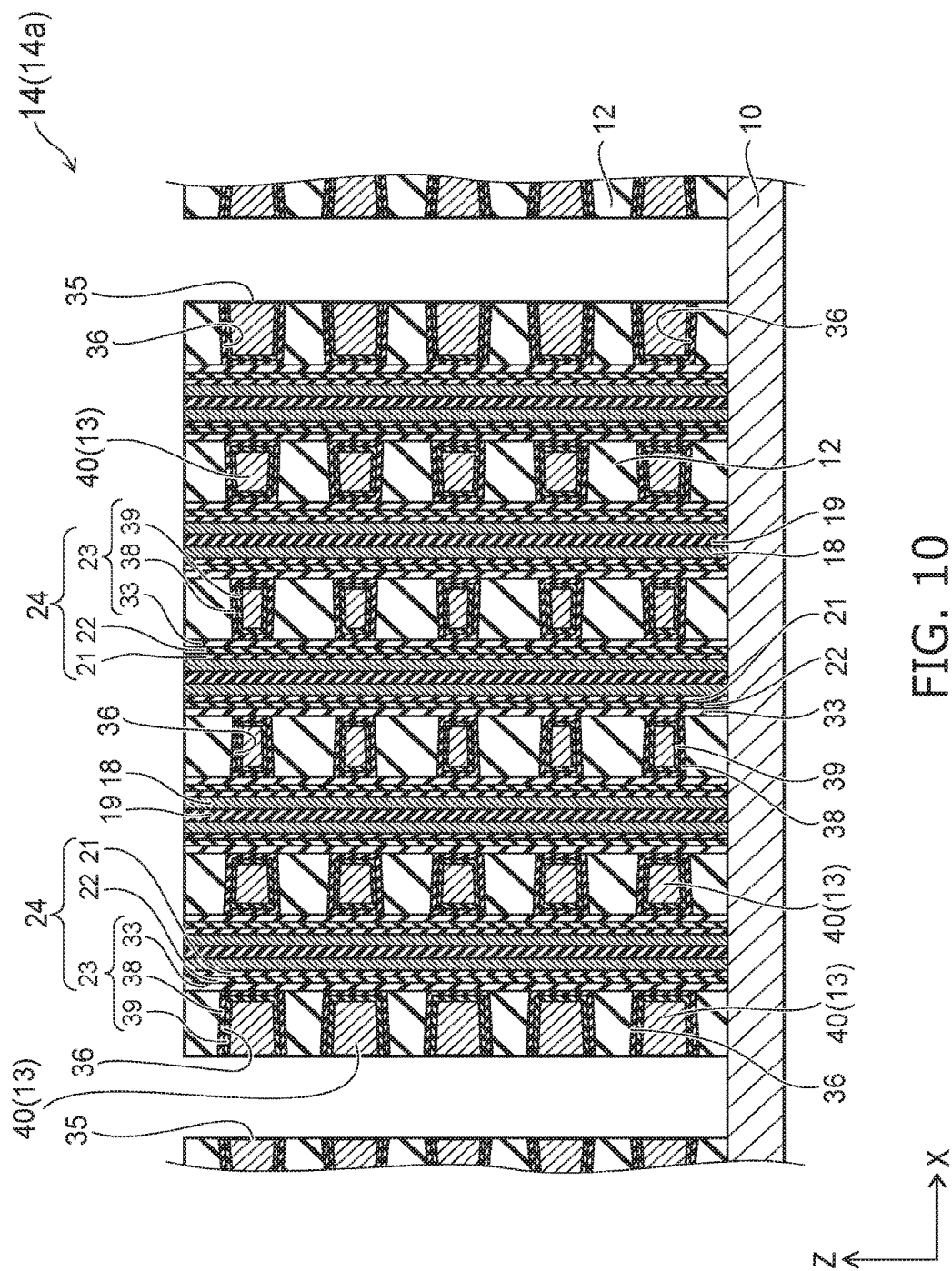
FIG. 10 is a cross-sectional view showing the method for manufacturing the semiconductor memory device according to the first embodiment.

FIG. 10 is a cross-sectional view showing the method for manufacturing the semiconductor memory device according to the embodiment.

Figure 3:
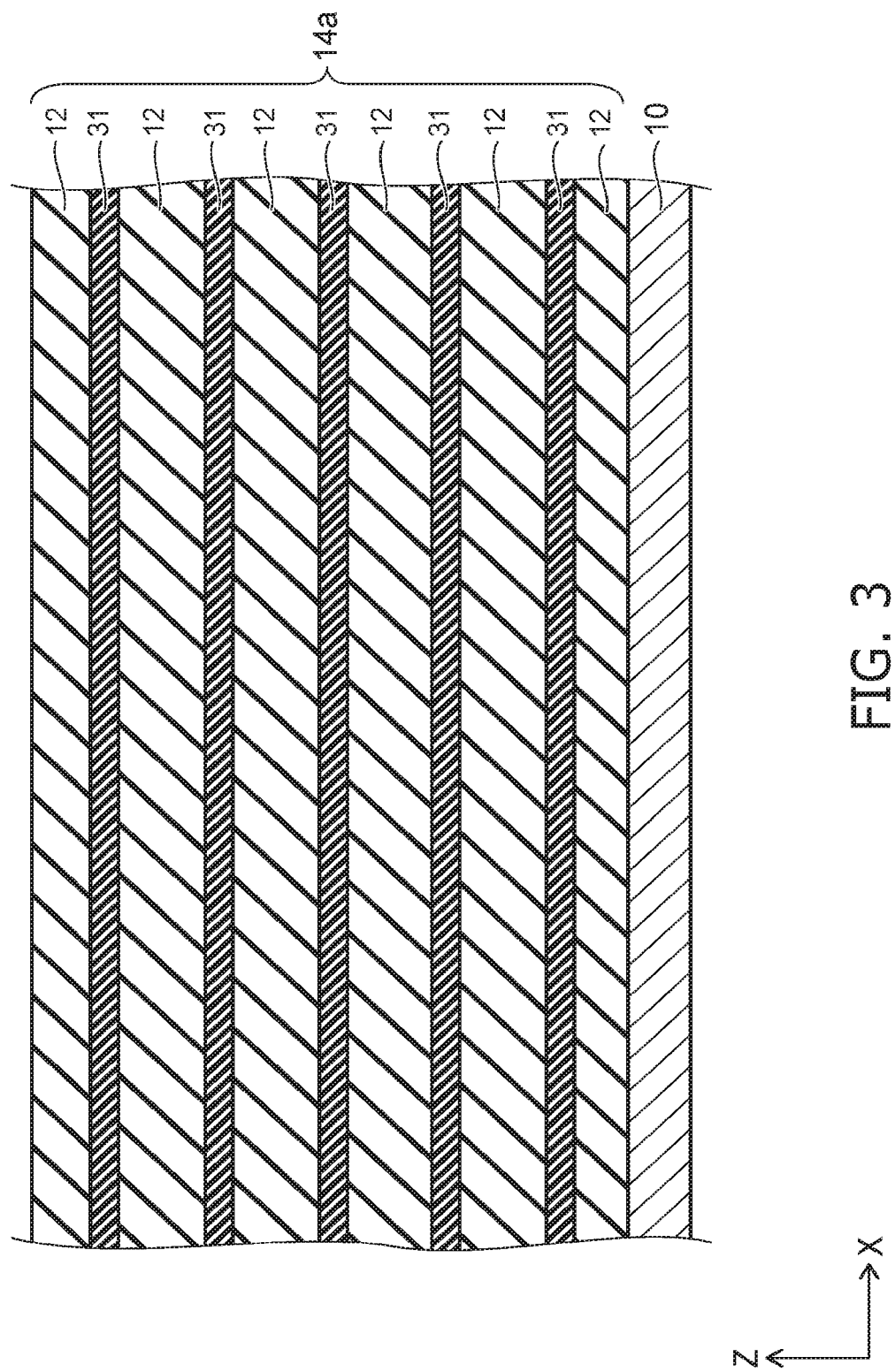
FIG. 3 to FIG. 8 are cross-sectional views showing a method for manufacturing a semiconductor memory device according to the first embodiment.

First, the silicon substrate 10 is prepared as shown in FIG. 3. Then, a stacked body 14a is formed on the silicon substrate 10 by stacking the inter-layer insulating films 12 and sacrificial films 31 alternately along the Z-direction. For example, the inter-layer insulating films 12 are formed of silicon oxide. The sacrificial films 31 are formed of a material that provides etching selectivity with respect to the inter-layer insulating films 12 and is formed of, for example, silicon nitride.

Figure 4:
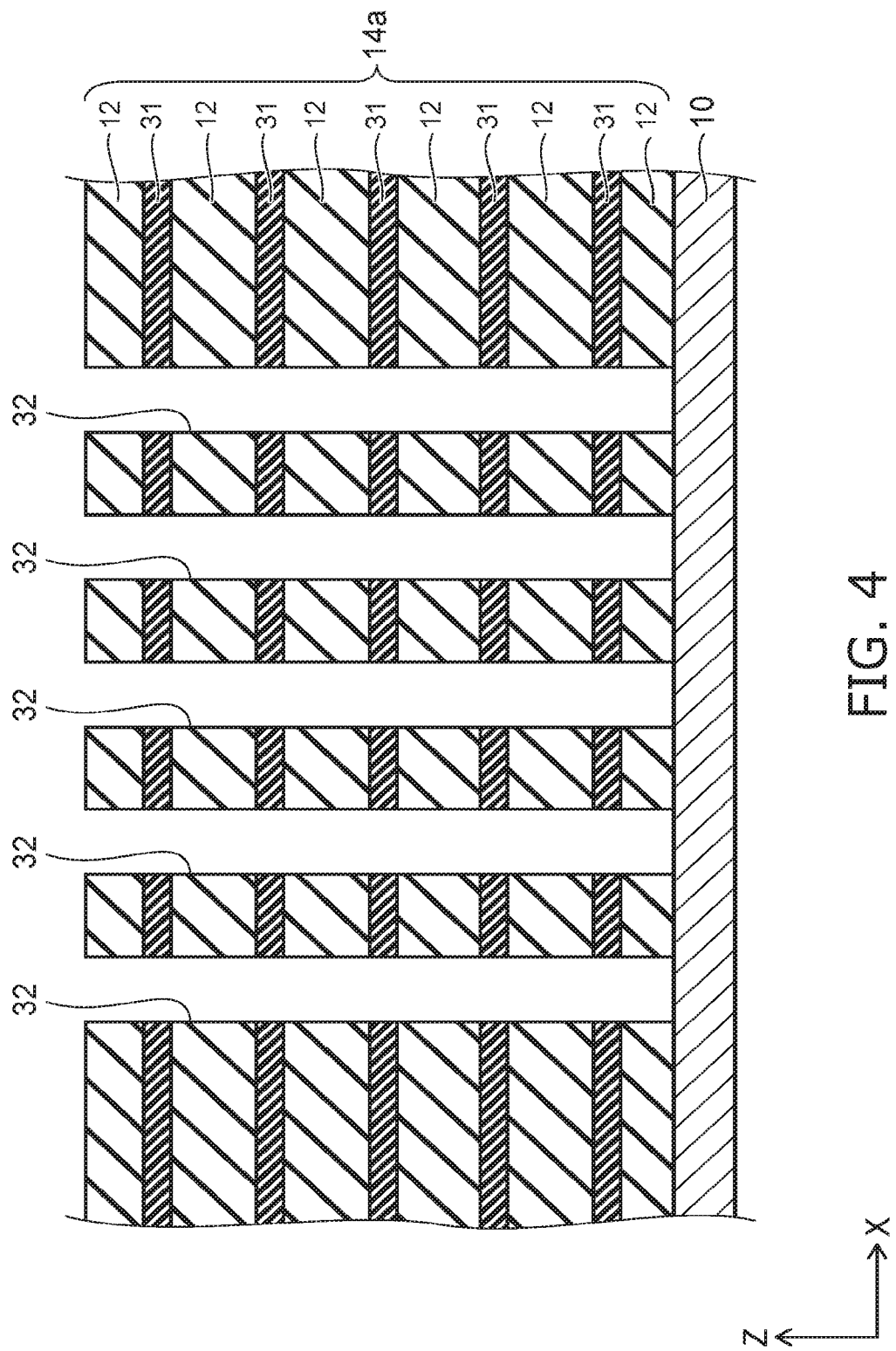

Then, as shown in FIG. 4, multiple memory holes 32 are made in the stacked body 14a by, for example, RIE (Reactive Ion Etching). The memory holes 32 extend in the Z-direction, pierce the stacked body 14, and reach the silicon substrate 10. Also, when viewed from the Z-direction, the memory holes 32 are disposed in, for example, a staggered configuration.

Figure 5:
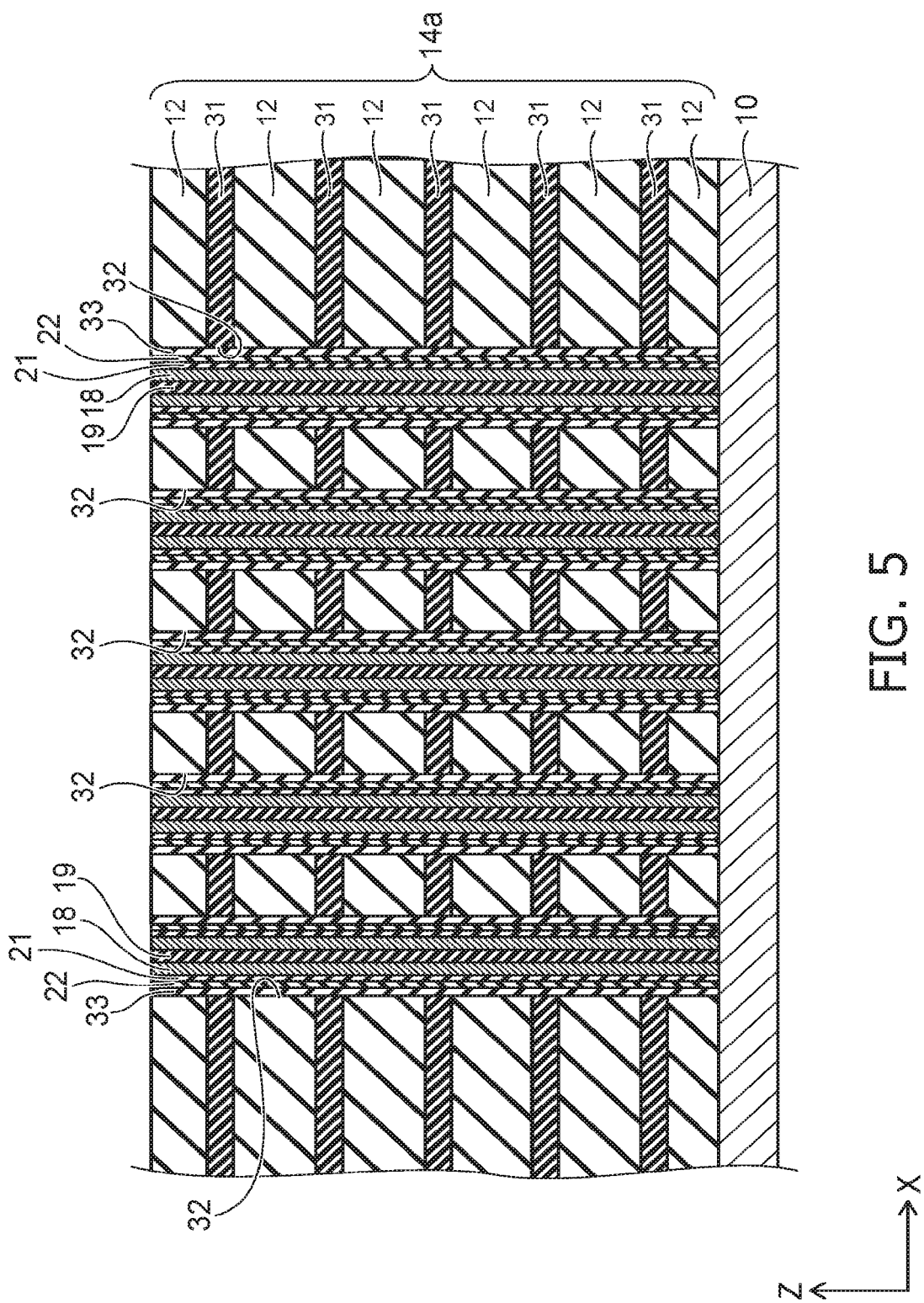

Then, as shown in FIG. 5, a silicon oxide layer 33 is formed on the inner surfaces of the memory holes 32 by, for example, depositing silicon oxide by CVD (Chemical Vapor Deposition). Then, the charge storage film 22 is formed on the silicon oxide layer 33 by depositing silicon nitride. Then, the tunneling insulating film 21 is formed on the charge storage film 22 by, for example, depositing silicon oxide.

Then, the silicon pillar 18 that has a cylindrical configuration is formed on the inner surface of the memory hole 32 by depositing silicon on the tunneling insulating film 21. At this time, for example, a silicon layer is deposited on the tunneling insulating film 21; the silicon substrate 10 is exposed by removing the film that is deposited on the bottom surface of the memory hole 32 by RIE; and subsequently, silicon is deposited again. Thereby, the silicon pillar 18 having the lower end connected to the silicon substrate 10 is formed. Then, the insulating member 19 is filled into the memory hole 32 by depositing silicon oxide on the inner surface of the silicon pillar 18.

Figure 6:
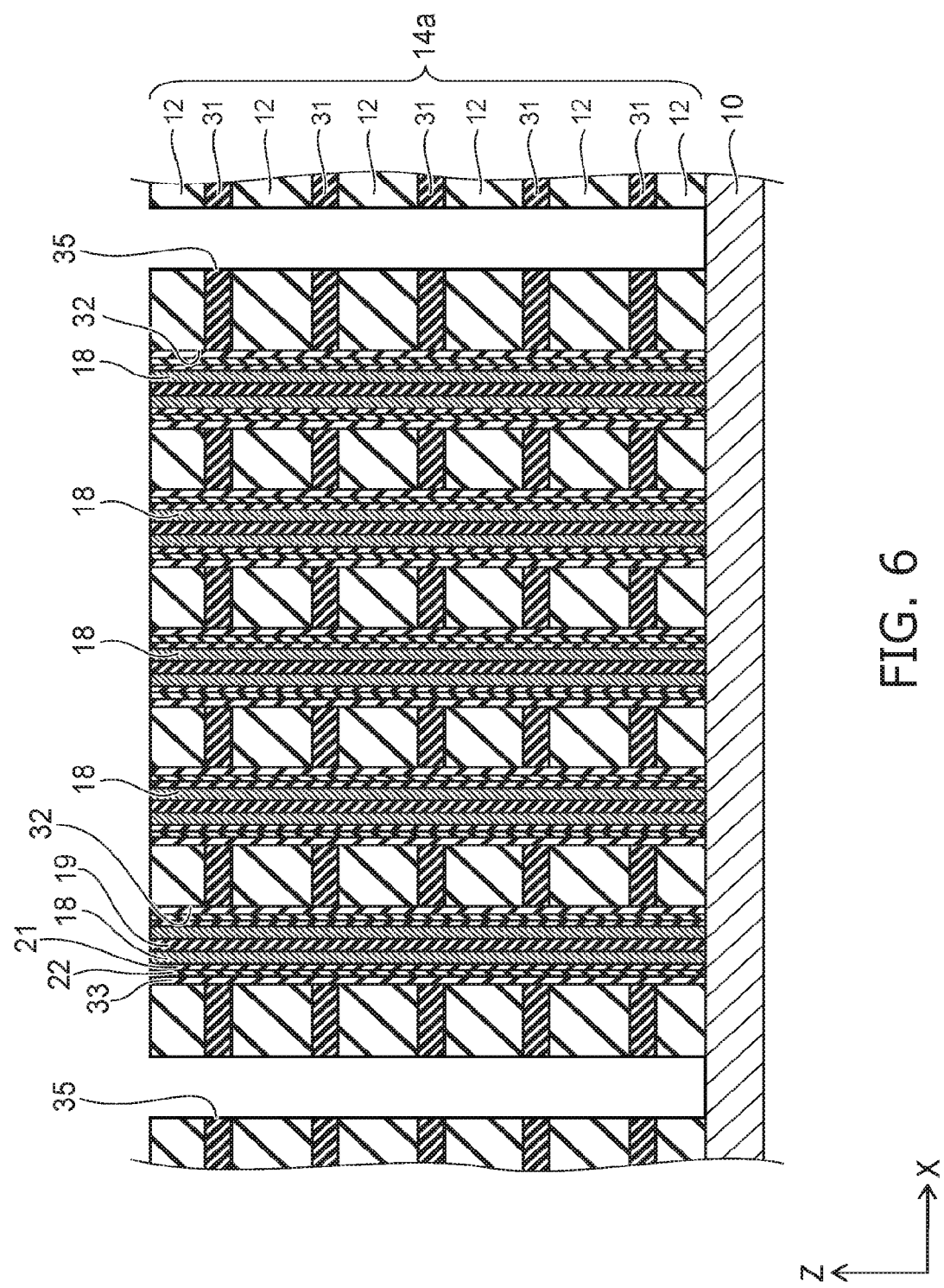

Then, as shown in FIG. 6, multiple slits 35 that extend in the Y-direction are made in the stacked body 14a. The slits 35 pierce the stacked body 14a. Thereby, the silicon substrate 10 is exposed at the bottom surfaces of the slits 35. The multiple silicon pillars 18 that are disposed in the staggered configuration are disposed between the mutually-adjacent slits 35.

Figure 7:
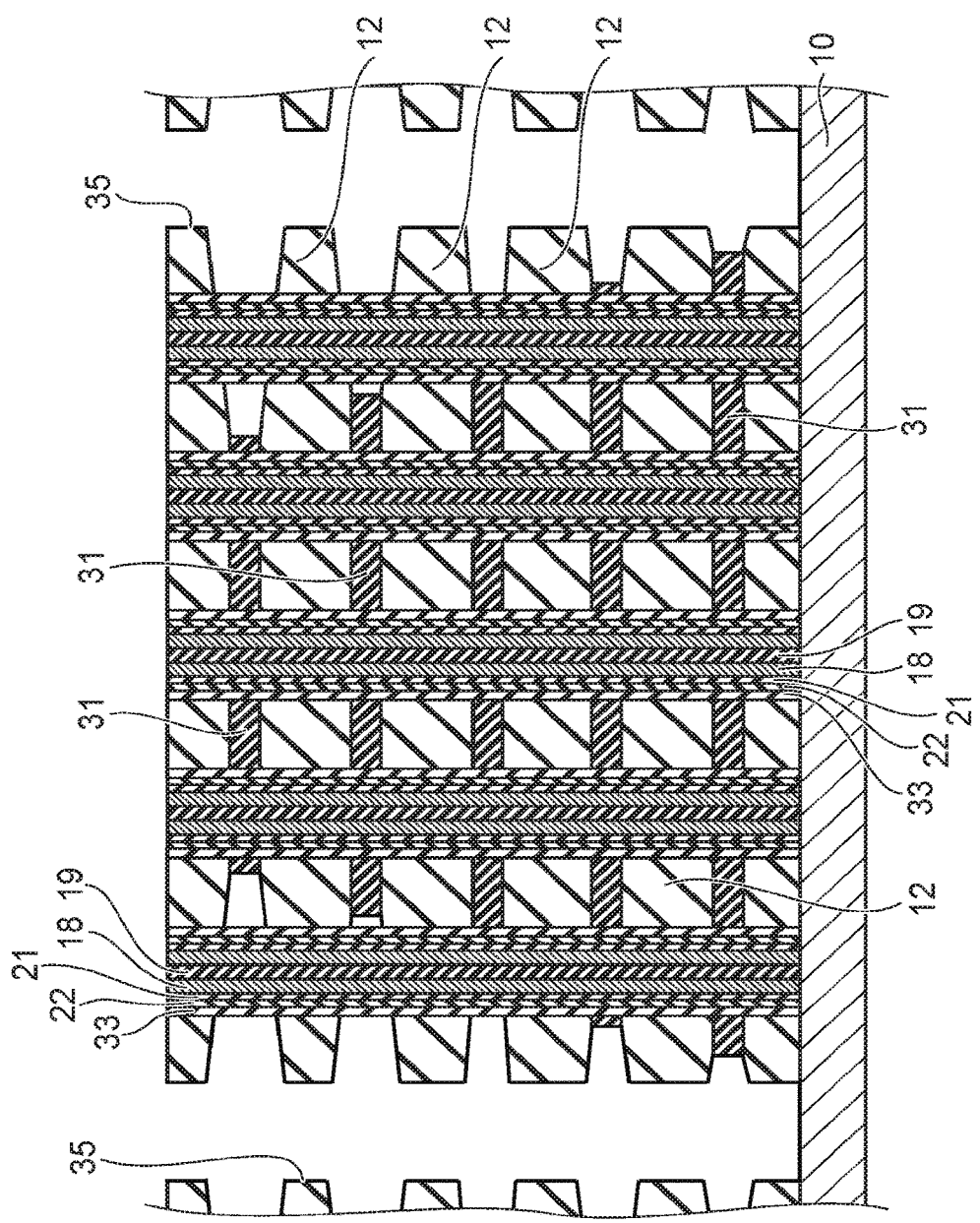

Then, as shown in FIG. 7, wet etching is performed via the slits 35. At this time, although the conditions of the wet etching are conditions such that the etching rate of the sacrificial films 31 is higher than the etching rate of the inter-layer insulating films 12, the etching selectivity is adjusted so that not only the sacrificial films 31 but also the inter-layer insulating films 12 are etched somewhat.

Thereby, as the sacrificial films 31 are removed, the upper surface and lower surface of the inter-layer insulating film 12 are exposed sequentially from the side proximal to the slit 35; and the exposed region is etched at a rate that is lower than that of the sacrificial films 31. Because the regions of the surface of the inter-layer insulating film 12 that are exposed to the etchant for a longer time are etched and recede more, the upper surface and lower surface of the inter-layer insulating film 12 are patterned into a tapered configuration from the slit 35 side. At this time, the etching rate of the silicon oxide layers 33 is lower than that of the inter-layer insulating films 12 because the silicon oxide layers 33 have film properties different from those of the inter-layer insulating films 12; and the silicon oxide layers 33 are not etched much. Also, compared to the sacrificial films 31 of the lower levels, the etching of the sacrificial films 31 of the upper levels progresses more because new etchant is supplied more efficiently to the sacrificial films 31 of the upper levels.

Figure 8:
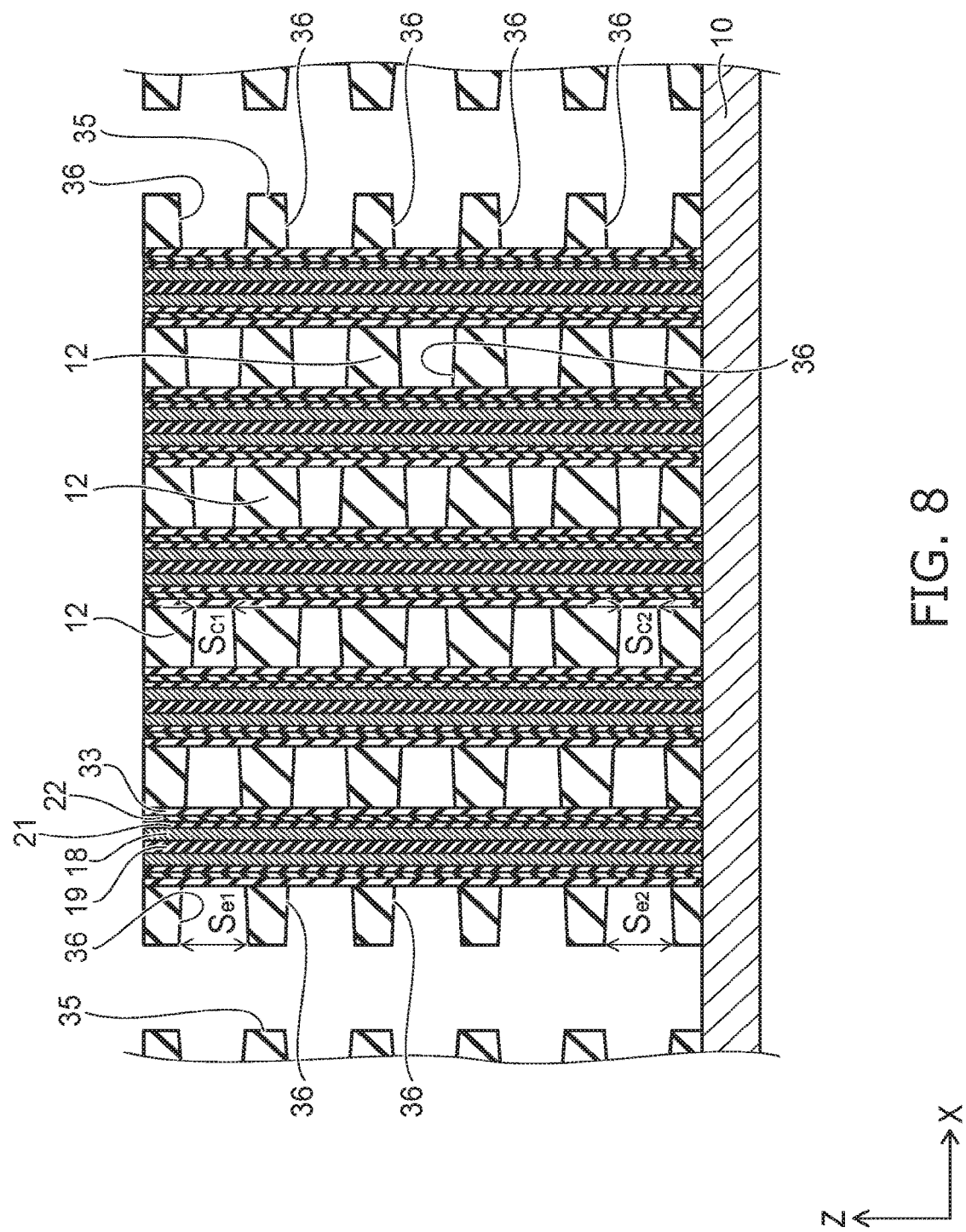

As a result, as shown in FIG. 8, after all of the sacrificial films 31 (referring to FIG. 7) are removed, spaces 36 are made between the inter-layer insulating films 12. The height, i.e., a length $s_{e1}$ in the Z-direction, of the end portion of the space 36 on the slit 35 side is greater than a height $s_{c1}$ of the central portion of the space 36 between the pair of mutually-adjacent slits 35. In other words, $s_{e1} > s_{c1}$.

Also, at this time, toward the inter-layer insulating films 12 of the upper levels, the etching progresses more and the angle of the tilt with respect to the XY plane of the upper surface and lower surface of the inter-layer insulating film 12 is larger because new etchant is supplied more efficiently toward the upper portion of the slit 35. As a result, the entrance area of the space 36 is wider toward the upper levels. In other words, $(s_{e1}-s_{c1}) > (s_{e2}-s_{c2})$, where the height of the end portion is $s_{e1}$, the height of the central portion is $s_{c1}$ for the space 36 on the slit 35 side that is relatively at an upper level, the height of the end portion is $s_{e2}$, and the height of the central portion is $s_{c2}$ for the space 36 that is relatively at a lower level.

The etchant includes, for example, hot phosphoric acid ($H_3PO_4$). In the case where hot phosphoric acid is used, the etching selectivity ($SiN/SiO_2$) of silicon nitride to silicon oxide can be controlled by adjusting the temperature of the etchant or the silicon concentration inside the liquid. Specifically, the etching selectivity ($SiN/SiO_2$) increases when the temperature of the etchant is reduced. Also, the etching selectivity ($SiN/SiO_2$) increases when the silicon concentration in the etchant is increased.

As shown in FIG. 9A, for some conditions, the etching selectivity ($SiN/SiO_2$) of silicon nitride to silicon oxide is 200 for a temperature of the etchant of 160° C.; the etching selectivity is 400 for 155° C.; and the etching selectivity is 600 for 150° C. Thus, the etching selectivity improves as the temperature decreases.

As shown in FIG. 9B, for some conditions, the etching selectivity ($SiN/SiO_2$) of silicon nitride to silicon oxide is 150 for a silicon concentration in the etchant of 50 ppm; the etching selectivity is 200 for 60 ppm; and the etching selectivity is 500 for 70 ppm. Thus, the etching selectivity improves as the silicon concentration increases.

Then, as shown in FIG. 10, an aluminum oxide layer 38 is formed and then a silicon oxide layer 39 is formed via the slits 35 on the inner surfaces of the spaces 36 and on the side surfaces of the slits 35. A hafnium oxide layer may be formed instead of the aluminum oxide layer 38. The blocking insulating film 23 is formed of the silicon oxide layer 33, the aluminum oxide layer 38, and the silicon oxide layer 39. Also, the memory film 24 is formed of the blocking insulating film 23, the charge storage film 22, and the tunneling insulating film 21.

In FIG. 2, the silicon oxide layer 33, the aluminum oxide layer 38, and the silicon oxide layer 39 are shown collectively as the blocking insulating film 23. Also, the portions of the silicon oxide layer 33 that contact the inter-layer insulating films 12 are shown as portions of the inter-layer insulating films 12.

Then, a barrier metal layer (not shown) that is made of titanium and titanium nitride is formed via the slits 35 on the inner surfaces of the spaces 36 and on the side surfaces of the slits 35. Then, a conductive material 40 is deposited on the barrier metal layer. At this time, because the height of the space 36 on the slit 35 side is high, the conductive material 40 is filled efficiently into the space 36; and a void is not made.

Then, the conductive material 40, the silicon oxide layer 39, and the aluminum oxide layer 38 that are deposited inside the slits 35 are removed by performing, for example, RIE. Thereby, the electrode films 13 are formed of the conductive material 40 that is filled into the spaces 36. As a result, the sacrificial films 31 are replaced with the electrode films 13; and the stacked body 14a becomes the stacked body 14.

Then, as shown in FIG. 2, the insulating members 17 are formed by depositing an insulating material on the side surfaces of the slit 35. Then, the source electrode 16 is formed inside the slit 35 by depositing a conductive material on the side surfaces of the insulating members 17. The interior of the slit 35 is filled with the insulating members 17 and the source electrode 16.

Then, the inter-layer insulating film 25 is formed on the stacked body 14. Then, plug holes are made in the inter-layer insulating film 25 in the regions directly above the silicon pillars 18; and the plugs 26 are filled into the plug holes. Then, the bit lines 27 that extend in the X-direction are formed on the inter-layer insulating film 25. Thus, the semiconductor memory device 1 according to the embodiment is manufactured.

Effects of the embodiment will now be described.

In the embodiment, the inter-layer insulating films 12 that are made of silicon oxide also are etched when etching the sacrificial films 31 made of silicon nitride in the process shown in FIG. 7. However, the etching selectivity is adjusted so that the etching rate of the inter-layer insulating films 12 is lower than the etching rate of the sacrificial films 31. Thereby, as shown in FIG. 8, the space 36 that has a wide entrance area on the slit 35 side is made between the inter-layer insulating films 12. Therefore, the fillability when filling the conductive material 40 inside the spaces 36 in the process shown in FIG. 10 is high. As a result, voids that occur inside the electrode films 13 can be suppressed; and the interconnect resistance of the electrode films 13 can be reduced. Also, discrepancies such as electromigration, etc., having the voids as starting points can be prevented from occurring. Thus, according to the embodiment, a semiconductor memory device that has a low interconnect resistance even when downscaled can be realized.

Although a method may be considered in which the spaces 36 are made to be large by forming the sacrificial films 31 to be thick in the process shown in FIG. 3, in such a case, there is a risk that the inter-layer insulating films 12 may become too thin and the necessary breakdown voltage may not be ensured.

Modification of First Embodiment

A modification of the first embodiment will now be described.

Figure 11:
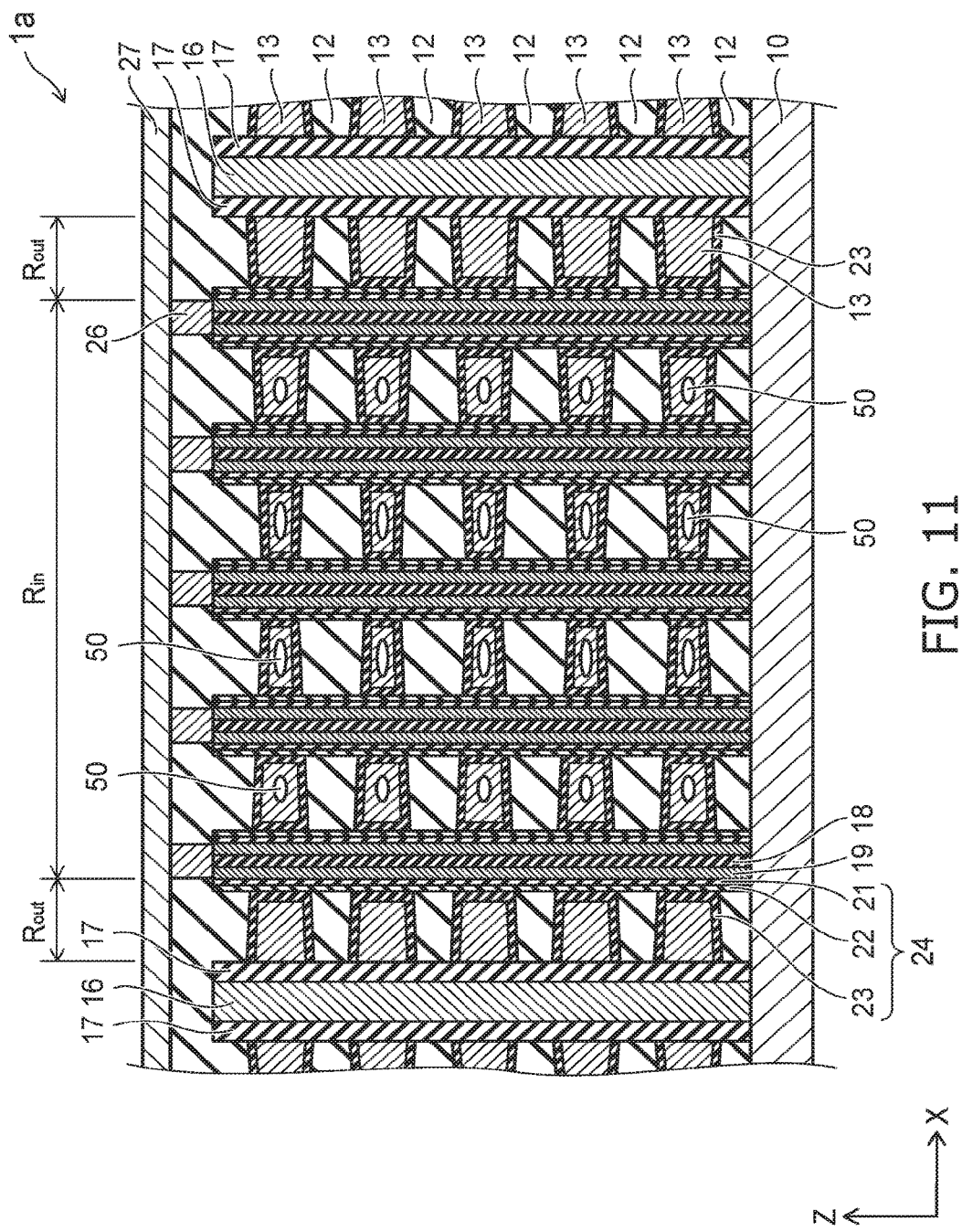
FIG. 11 is a cross-sectional view showing a semiconductor memory device according to a modification of the first embodiment.

FIG. 11 is a cross-sectional view showing a semiconductor memory device according to the modification.

In the semiconductor memory device 1a according to the modification as shown in FIG. 11, voids 50 are made in the electrode films 13. However, the voids 50 are made in the portions of the electrode film 13 interposed between the insulating members 17, that is, inside the portions of the word line WL disposed between the silicon pillars 18, and are not made in the portion disposed between the insulating member 17 and the silicon pillar 18 most proximal to the insulating member 17.

In other words, the voids 50 are made in an inner region $R_{in}$ but are not made in outer regions $R_{out}$, where the inner region $R_{in}$ is the region interposed between the pair of mutually-adjacent insulating members 17 where the electrode films 13 are disposed in band configurations and the multiple silicon pillars 18 arranged in the staggered configuration are disposed, and the outer regions $R_{out}$ are the regions on the two sides of the inner region $R_{in}$, i.e., the regions between the insulating members 17 and the silicon pillars 18 most proximal to the insulating members 17.

In the modification as well, the interconnect resistance of the electrode film 13 can be maintained to be somewhat low because the voids 50 are not made in the portion of the electrode film 13 disposed in the outer region $R_{out}$ where the film thickness is relatively thick.

Otherwise, the configuration, the manufacturing method, and the effects of the modification are similar to those of the first embodiment described above.

Second Embodiment

A second embodiment will now be described.

Figure 12:
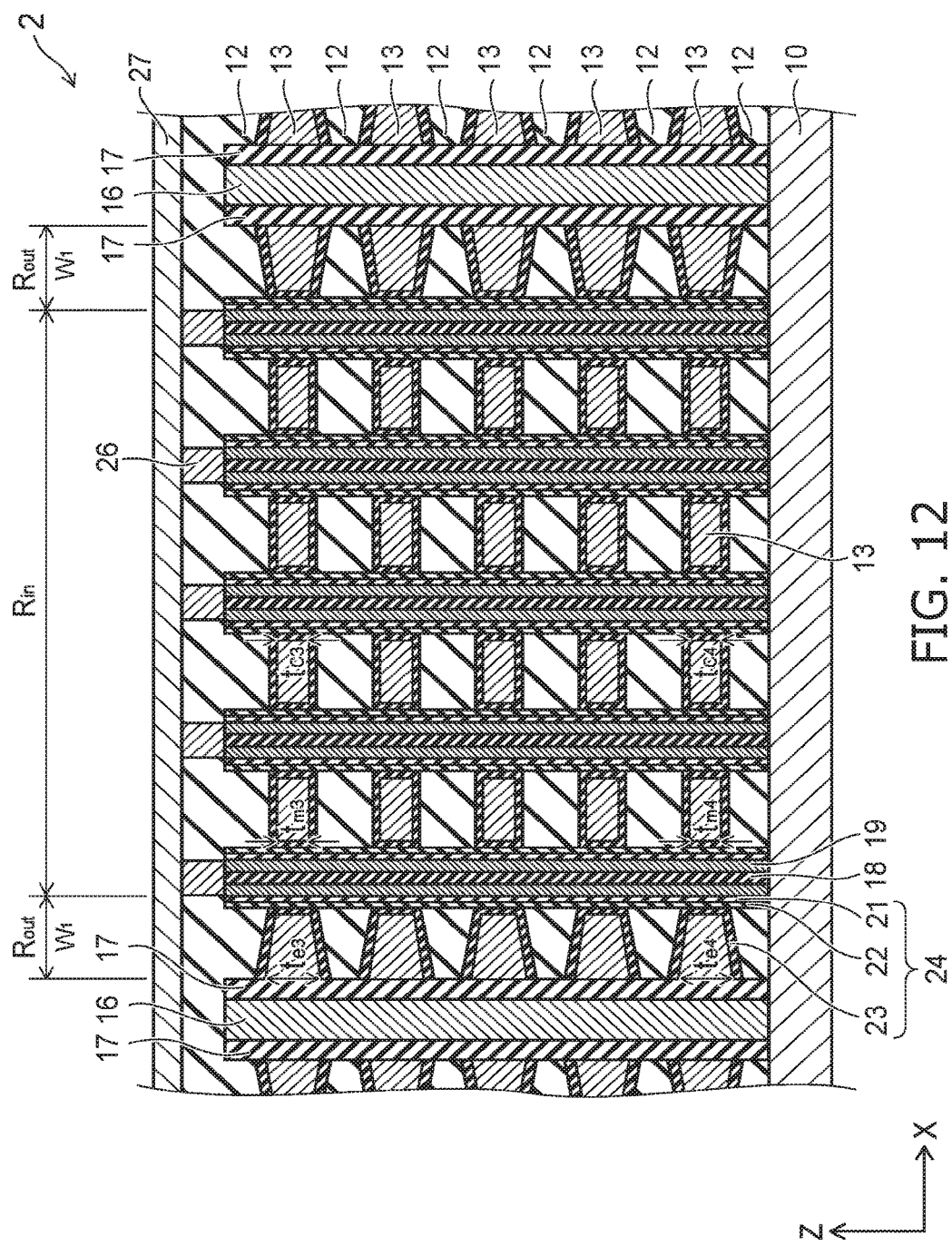
FIG. 12 is a cross-sectional view showing a semiconductor memory device according to a second embodiment.

FIG. 12 is a cross-sectional view showing a semiconductor memory device according to the embodiment.

As shown in FIG. 12, the configuration of the electrode film 13 of the semiconductor memory device 2 according to the embodiment is different from that of the semiconductor memory device 1 according to the first embodiment described above (referring to FIG. 2). In the semiconductor memory device 2, the thicknesses of the portions of the electrode film 13 disposed in the inner region $R_{in}$ are substantially uniform; and the thickness of the portion disposed in the outer region $R_{out}$ becomes thicker toward the insulating member 17.

In other words, in one XZ cross section, $t_{e3} > t_{m3} \approx t_{c3}$, where the thickness of the portion of the electrode film 13 most proximal to the insulating member 17 is $t_{e3}$, the thickness of the portion positioned at the boundary between the inner region $R_{in}$ and the outer region $R_{out}$ is $t_{m3}$, and the thickness of the portion positioned at the center of the inner region $R_{in}$ is $t_{c3}$. Accordingly, $(t_{e3} - t_{m3}) > (t_{m3} - t_{c3})$. In other words, the difference between the maximum value and the minimum value of the thickness of the portion of the electrode film 13 disposed between the insulating member 17 and the silicon pillar 18 is larger than the difference between the maximum value and the minimum value of the thickness for the portions of the electrode film 13 disposed between the multiple silicon pillars 18.

For example, in one XZ plane, the difference is $(t_{e3} - t_{m3})$, where the maximum value of the thickness of the portion of the electrode film 13 disposed in the outer region $R_{out}$ is $t_{e3}$, and the minimum value is $t_{m3}$. On the other hand, the length in the X-direction of the outer region $R_{out}$, i.e., the distance between the insulating member 17 and the silicon pillar 18 most proximal to the insulating member 17, is $W_1$. In such a case, the value of the ratio of the difference $(t_{e3} - t_{m3})$ to the distance $W_1$ $((t_{e3} - t_{m3})/W_1)$ is 0.1 or more. In other words, $(t_{e3} - t_{m3})/W_1 \geq 0.1$. The distance $W_1$ is, for example, 50 nm.

Also, the configuration of the electrode film 13 is dependent also on the position in the Z-direction inside the stacked body 14; and the difference of the thickness is larger for the electrode films 13 of the upper levels. In other words, as shown in FIG. 12, in the case where the thicknesses $t_{e4}$, $t_{m4}$, and $t_{c4}$ are set for the electrode film 13 of a lower level, $t_{e4} > t_{m4} \approx t_{c4}$, and $(t_{e4} - t_{m4}) > (t_{m4} - t_{c4})$ hold; and $t_{e3} > t_{e4}$ and $(t_{e3} - t_{m3}) > (t_{e4} - t_{m4})$ hold.

A method for manufacturing the semiconductor memory device according to the embodiment will now be described.

Figure 13:
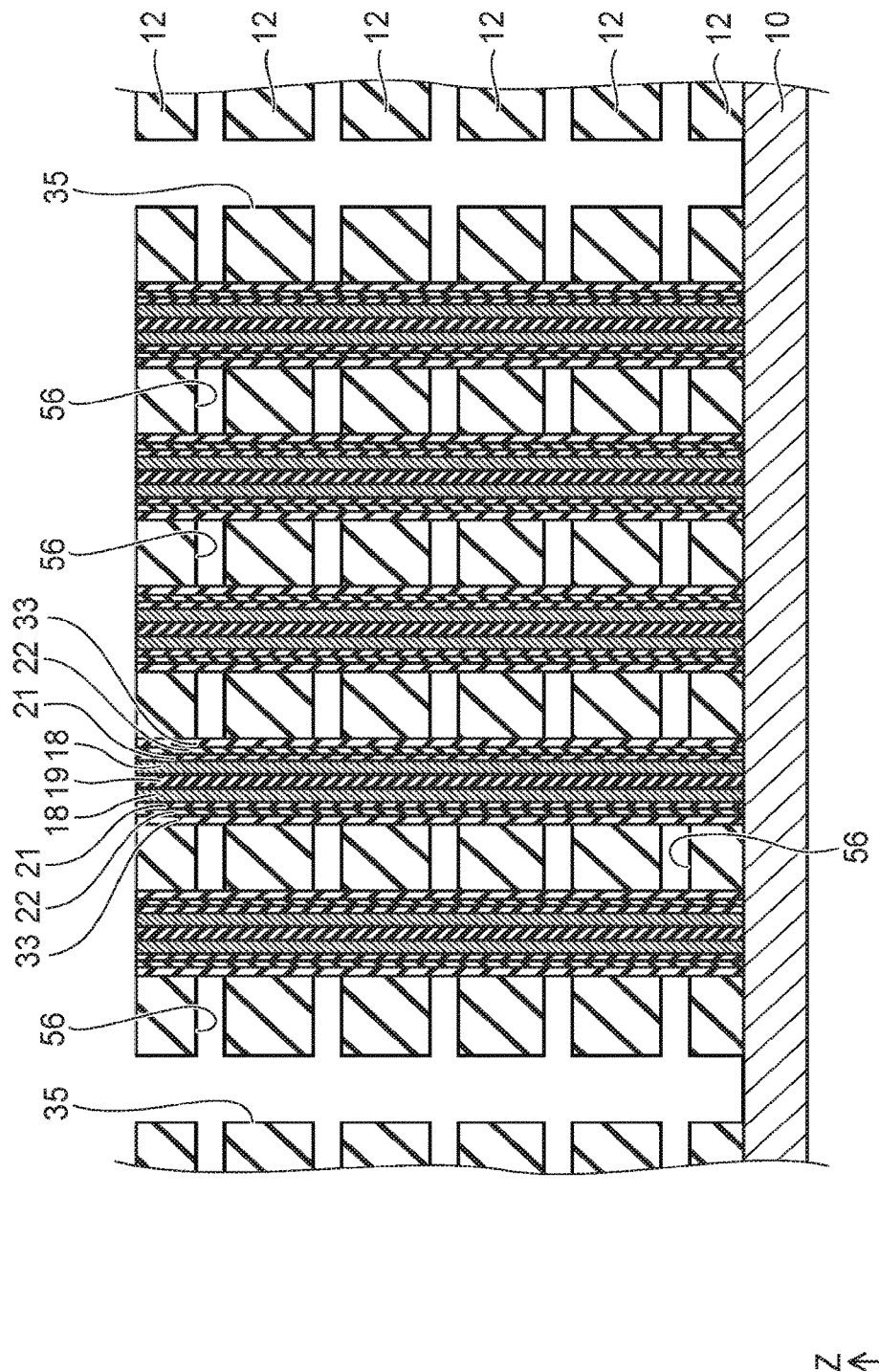
FIG. 13 and FIG. 14 are cross-sectional views showing a method for manufacturing a semiconductor memory device according to the second embodiment.
Figure 14:
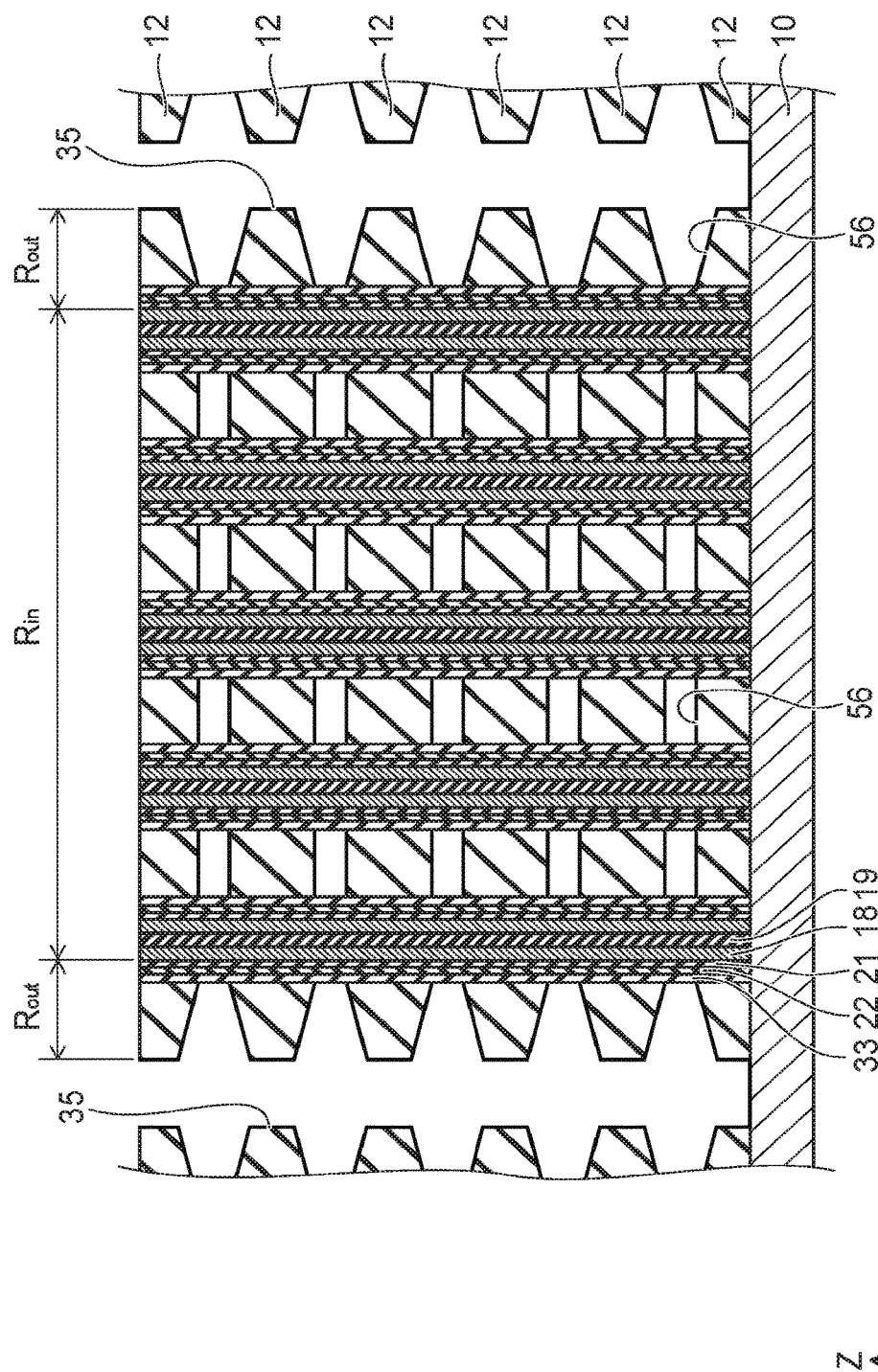

FIG. 13 and FIG. 14 are cross-sectional views showing the method for manufacturing the semiconductor memory device according to the embodiment.

First, the processes shown in FIG. 3 to FIG. 6 are implemented.

Then, as shown in FIG. 13, the sacrificial films 31 (referring to FIG. 6) are removed by performing wet etching via the slits 35. The etching conditions at this time are conditions such that the etching selectivity of the sacrificial films 31 with respect to the inter-layer insulating films 12 is sufficiently large. Therefore, the inter-layer insulating films 12 are substantially not etched when etching the sacrificial films 31. Thereby, spaces 56 are made between the inter-layer insulating films 12.

Then, as shown in FIG. 14, isotropic etching of silicon oxide is performed via the slits 35 for a short period of time. For example, wet etching is performed in which DHF (diluted hydrofluoric acid) or BHF (buffered hydrofluoric acid) is used as the etchant. Thereby, the portions of the inter-layer insulating films 12 disposed on the slit 35 side are etched and patterned into tapered configurations. As a result, the configurations of the spaces 56 are such that the thicknesses of the portions disposed in the inner region $R_{in}$ are substantially uniform, and the portion disposed in the outer region $R_{out}$ has a tapered configuration in which the length in the Z-direction lengthens toward the slit 35.

The subsequent processes are similar to those of the first embodiment described above.

Effects of the embodiment will now be described.

In the embodiment as well, similarly to the first embodiment described above, the fillability of the conductive material is high because the height of the portion of the space 56 communicating with the slit 35 is high; and voids do not occur easily inside the electrode film 13. Thereby, the interconnect resistance of the electrode film 13 can be suppressed to be low.

Otherwise, the configuration, the manufacturing method, and the effects of the embodiment are similar to those of the first embodiment described above.

Although the portions of the electrode film 13 where the thicknesses are substantially uniform are disposed mainly in the inner region $R_{in}$ and the portions having the tapered configurations are disposed mainly in the outer region $R_{out}$, this positional relationship is not strict; and the portions of the electrode film 13 where thicknesses are substantially uniform may be disposed in a portion of the outer region $R_{out}$; and the portions that have the tapered configurations may be disposed in the inner region $R_{in}$.

Third Embodiment

A third embodiment will now be described.

Figure 15:
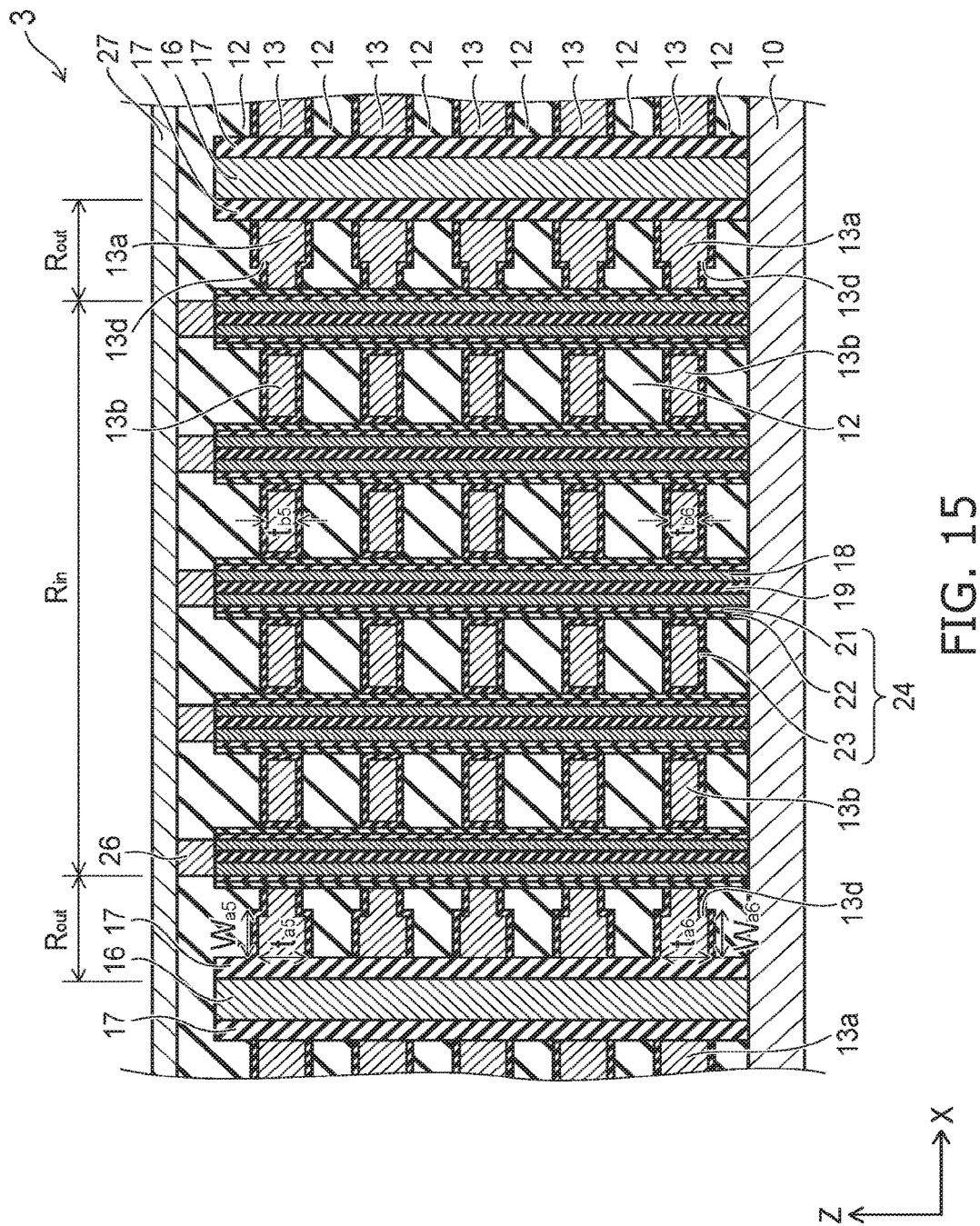
FIG. 15 is a cross-sectional view showing a semiconductor memory device according to a third embodiment.

FIG. 15 is a cross-sectional view showing a semiconductor memory device according to the embodiment.

As shown in FIG. 15, the configuration of the electrode film 13 of the semiconductor memory device 3 according to the embodiment is different from that of the semiconductor memory device 1 according to the first embodiment described above (referring to FIG. 2). In the semiconductor memory device 3, the electrode film 13 is divided into a thick plate portion 13a and a thin plate portion 13b; the thick plate portion 13a is disposed on the insulating member 17 side; and the thin plate portion 13b is disposed at positions separated from the insulating members 17 between the insulating members 17. A thickness $t_{a5}$ of the thick plate portion 13a is thicker than a thickness $t_{b5}$ of the thin plate portion 13b. In other words, $t_{a5} > t_{b5}$. Also, $t_{a6} > t_{b6}$.

A step 13d that extends in the Y-direction is formed at the boundary between the thick plate portion 13a and the thin plate portion 13b of the upper surface and lower surface of the electrode film 13. For example, the step 13d is disposed inside the outer region $R_{out}$ at the vicinity of the boundary with the inner region $R_{in}$. The step 13d of the electrode film 13 may be disposed inside the inner region $R_{in}$.

Also, the configuration of the electrode film 13 may be dependent on the position in the Z-direction; and for the electrode films 13 of the upper levels, the thickness of the thick plate portion 13a may be thicker and the step 13d may be formed at a position more distal to the insulating member 17. In other words, $t_{a5} > t_{a6}$, and $W_{a5} > W_{a6}$. On the other hand, the thickness of the thin plate portion 13b is substantially constant regardless of the position in the Z-direction. In other words, $t_{b5} \approx t_{b6}$.

A method for manufacturing the semiconductor memory device according to the embodiment will now be described.

Figure 16:
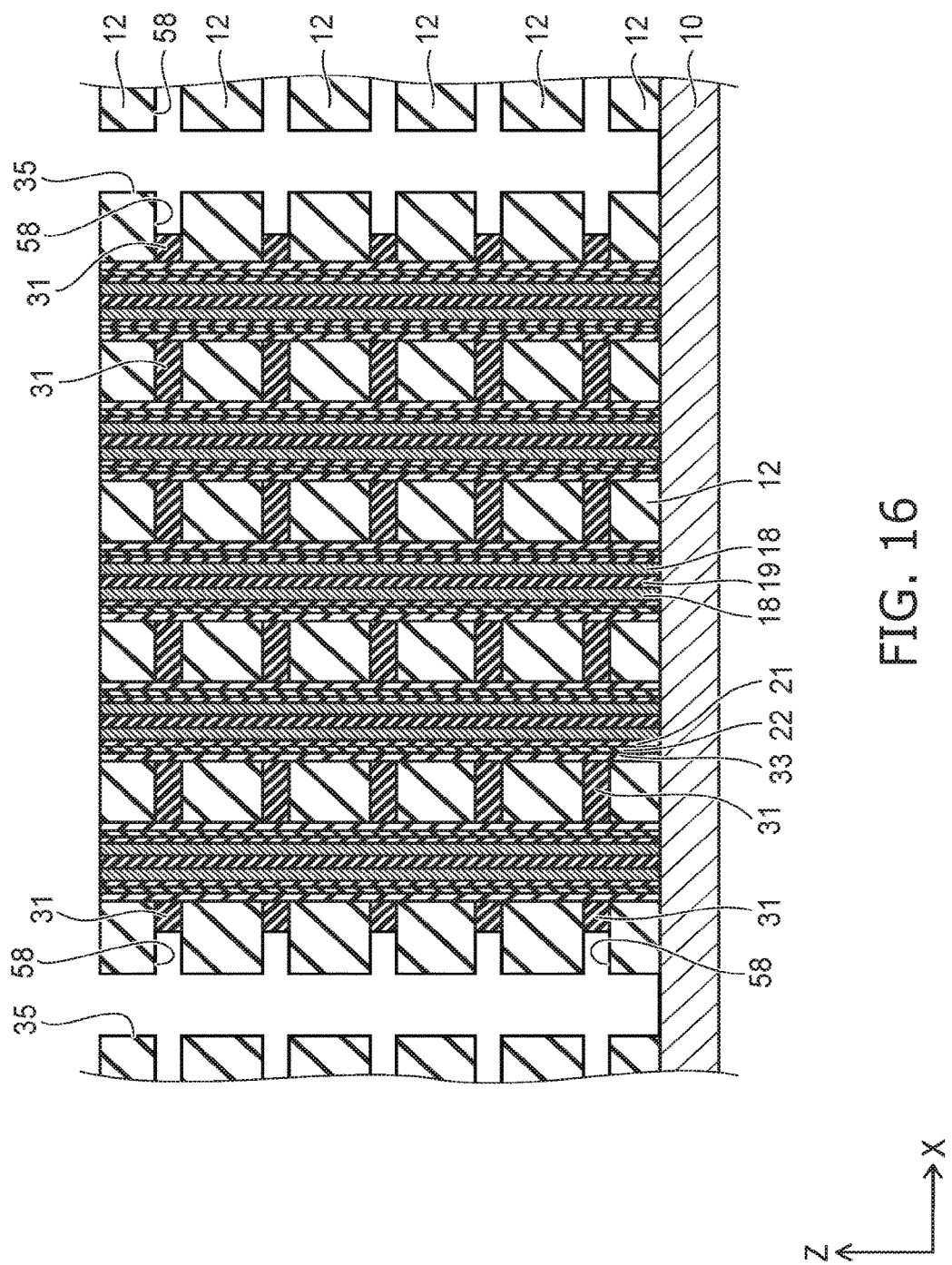
FIG. 16 to FIG. 18 are cross-sectional views showing a method for manufacturing a semiconductor memory device according to the third embodiment.
Figure 17:
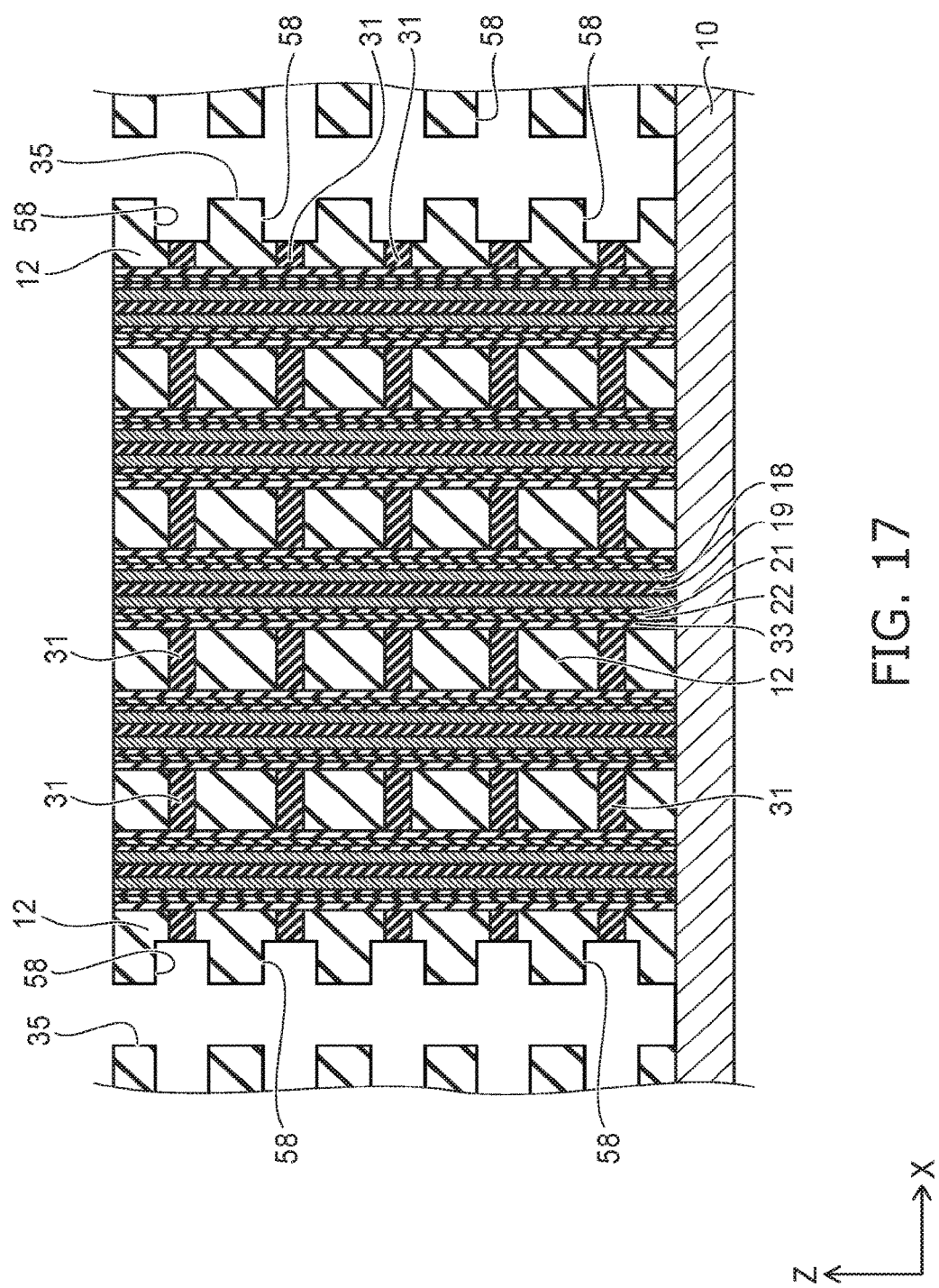
Figure 18:
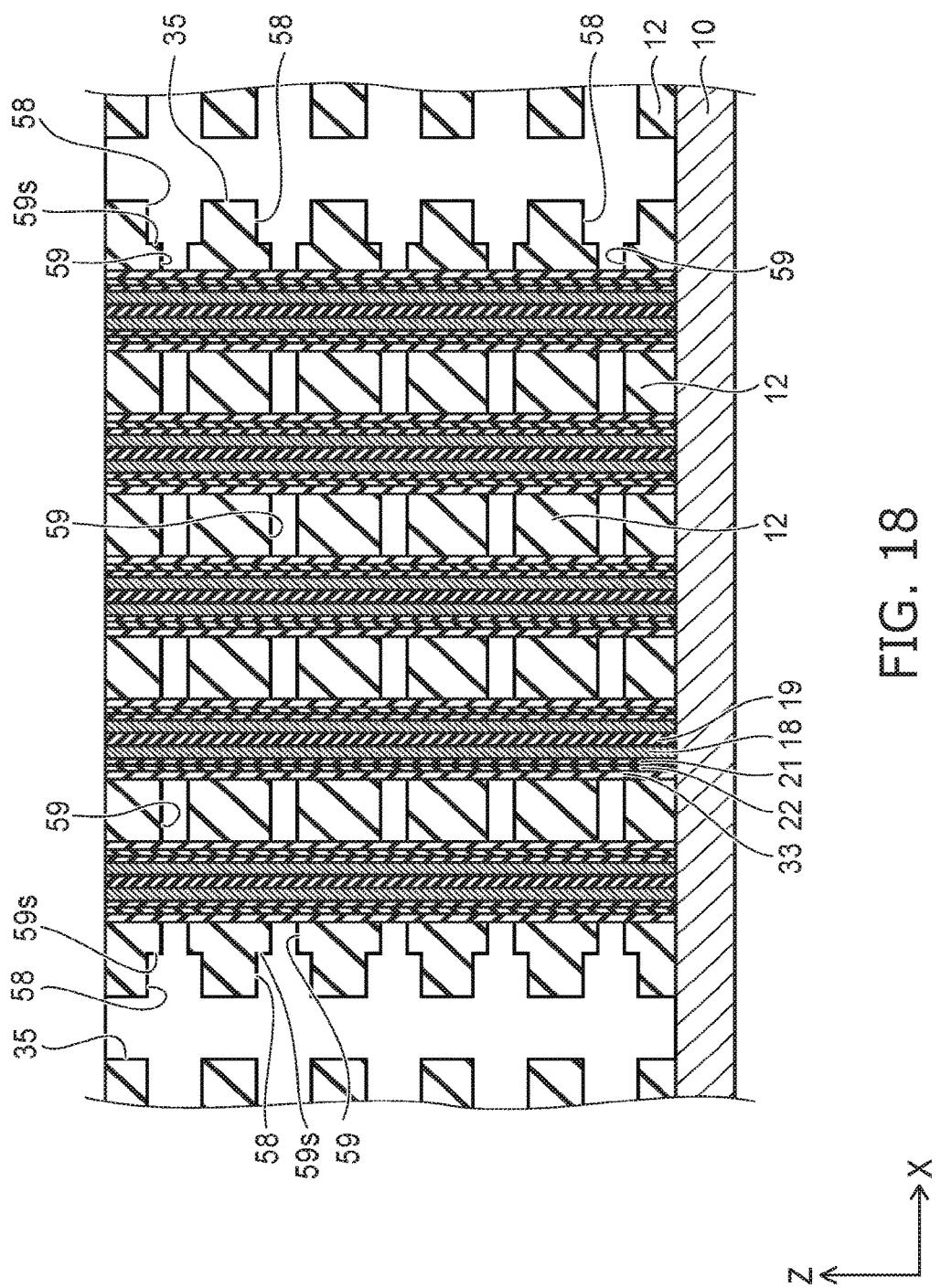

FIG. 16 to FIG. 18 are cross-sectional views showing the method for manufacturing the semiconductor memory device according to the embodiment.

First, the processes shown in FIG. 3 to FIG. 6 are implemented.

Then, as shown in FIG. 16, the portions of the sacrificial films 31 on the slit 35 side are removed by performing wet etching via the slits 35 using, for example, hot phosphoric acid for a short period of time. Thereby, an opening 58 that communicates with the slit 35 is made; and the regions of the upper surface and lower surface of the inter-layer insulating film 12 on the slit 35 side are exposed inside the opening 58. The depth of the opening 58 may be deeper toward the upper levels.

Then, as shown in FIG. 17, wet etching is performed via the slits 35 using, for example, DHF or BHF. Thereby, the exposed regions of the upper surface and lower surface of the inter-layer insulating film 12 recede; and the opening 58 expands in the Z-direction.

Then, as shown in FIG. 18, the remainders of the sacrificial films 31 are removed by performing wet etching via the slits 35 using, for example, hot phosphoric acid. Thereby, spaces 59 are made between the inter-layer insulating films 12. Although the space 59 communicates with the opening 58, a step 59s is formed at the boundary between the space 59 and the opening 58 because the length in the Z-direction of the space 59 is shorter than the length in the Z-direction of the opening 58.

Thereafter, the manufacturing method is similar to that of the first embodiment described above. In other words, the electrode films 13 are formed by filling a conductive material into the spaces 59 and the openings 58. At this time, the portions of the electrode films 13 disposed inside the spaces 59 become the thick plate portions 13a; and the portions disposed inside the openings 58 become the thin plate portions 13b.

Effects of the embodiment will now be described.

In the embodiment, similarly to the first embodiment described above, the fillability of the conductive material is high and voids do not occur easily inside the electrode film 13 because the length in the Z-direction of the opening 58 is longer than the length in the Z-direction of the space 59. Thereby, the interconnect resistance of the electrode film 13 can be suppressed to be low.

Otherwise, the configuration, the manufacturing method, and the effects of the embodiment are similar to those of the first embodiment described above.

According to the embodiments described above, a semiconductor memory device that has a low interconnect resistance even when downscaled and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
a substrate;
a pair of insulating members separated from each other, the pair of insulating members extending in a first direction;
a plurality of electrode films and a plurality of inter-layer insulating films disposed between the pair of insulating members and stacked alternately along a second direction, the second direction intersecting the first direction;
a plurality of semiconductor pillars extending in the second direction and piercing the plurality of electrode films and the plurality of inter-layer insulating films; and
a charge storage film disposed between one of the semiconductor pillars and one of the electrode films,
an end portion on a side of one of the insulating members of a first electrode film of the electrode films being thicker than a central portion of the first electrode film between the pair of insulating members,
an end portion on a side of one of the insulating members of a second electrode film of the electrode films being thicker than a central portion of the second electrode film between the pair of insulating members, the second electrode film being disposed between the substrate and the first electrode film,
a difference between a thickness of the end portion and a thickness of the central portion for the first electrode film being larger than a difference between a thickness of the end portion and a thickness of the central portion for the second electrode film.

2. The semiconductor memory device according to claim 1, wherein a difference between a thickness of the end portion and the thickness of the central portion of the first electrode film is 5 nm or more.

3. The semiconductor memory device according to claim 1, wherein a void is made in a portion of one of the electrode films disposed between the plurality of semiconductor pillars.

4. The semiconductor memory device according to claim 1, wherein a void is made in a portion of one of the electrode films disposed between the plurality of semiconductor pillars, and a void is not made in a portion of the one of the electrode films disposed between the insulating member and the semiconductor pillar most proximal to the insulating member.

5. The semiconductor memory device according to claim 1, wherein the first electrode film becomes thicker continuously from the central portion toward the end portion in one cross section perpendicular to the first direction.

6. The semiconductor memory device according to claim 5, wherein the value of a ratio of a difference between the thickness of the end portion and the thickness of the central portion of the first electrode film to a distance between the pair of insulating members in one cross section perpendicular to the first direction is 0.005 or more.

7. The semiconductor memory device according to claim 1, wherein a thickness of a portion of the first electrode film disposed between the plurality of semiconductor pillars is substantially uniform, and a thickness of a portion of the first electrode film disposed between one of the insulating members and the semiconductor pillar most proximal to the one of the insulating members becomes thicker toward the one of the insulating members.

8. The semiconductor memory device according to claim 1, wherein, in one cross section perpendicular to the first direction, a difference between a maximum value and a minimum value of a thickness of a portion of the first electrode film disposed between one of the insulating members and the semiconductor pillar most proximal to the one of the insulating members is larger than a difference between a maximum value and a minimum value of a thickness of a portion of the first electrode film disposed between the plurality of semiconductor pillars.

9. The semiconductor memory device according to claim 8, wherein, in the one cross section perpendicular to the first direction, the value of a ratio of the difference between the maximum value and the minimum value of the thickness of the portion of the first electrode film disposed between one of the insulating members and the semiconductor pillar most proximal to the one of the insulating members to a distance between the one of the insulating members and the semiconductor pillar most proximal to the one of the insulating members is 0.1 or more.

10. The semiconductor memory device according to claim 1, wherein a step is formed in each of an upper surface and a lower surface of the first electrode film, the step extending in the first direction.

11. The semiconductor memory device according to claim 10, wherein the step is disposed between one of the insulating members and the semiconductor pillar most proximal to the one of the insulating members.

12. A semiconductor memory device, comprising:
a pair of insulating members separated from each other, the pair of insulating members extending in a first direction;
a plurality of electrode films and a plurality of inter-layer insulating films disposed between the pair of insulating members and stacked alternately along a second direction, the second direction intersecting the first direction;
a plurality of semiconductor pillars extending in the second direction and piercing the plurality of electrode films and the plurality of inter-layer insulating films; and
a charge storage film disposed between one of the semiconductor pillars and one of the electrode films,
an end portion on a side of one of the insulating members of a first electrode film of the electrode films being thicker than a central portion of the first electrode film between the pair of insulating members,
in one cross section perpendicular to the first direction, a difference between a maximum value and a minimum value of a thickness of a portion of the first electrode film disposed between one of the insulating members and the semiconductor pillar most proximal to the one of the insulating members being larger than a difference between a maximum value and a minimum value of a thickness of a portion of the first electrode film disposed between the plurality of semiconductor pillars.

13. The semiconductor memory device according to claim 12, wherein, in the one cross section perpendicular to the first direction, the value of a ratio of the difference between the maximum value and the minimum value of the thickness of the portion of the first electrode film disposed between one of the insulating members and the semiconductor pillar most proximal to the one of the insulating members to a distance between the one of the insulating members and the semiconductor pillar most proximal to the one of the insulating members is 0.1 or more.

* * * * *